(12) United States Patent
Peng et al.

(10) Patent No.: US 8,549,453 B2
(45) Date of Patent: Oct. 1, 2013

(54) SEMICONDUCTOR DEVICE FEATURE DENSITY GRADIENT VERIFICATION

(75) Inventors: Young-Chow Peng, Hsinchu (TW);
Chung-Hui Chen, HsinChu (TW);
Chien-Hung Chen, Taipei (TW);
Po-Zeng Kang, Hsin-Hua (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/362,914

(22) Filed: Jan. 31, 2012

(65) Prior Publication Data

US 2013/0198710 A1   Aug. 1, 2013

(51) Int. Cl.
*G06F 17/50* (2006.01)

(52) U.S. Cl.
USPC ............... 716/111; 716/52; 716/54; 716/136

(58) Field of Classification Search
USPC ...................................... 716/52, 54, 111.136
See application file for complete search history.

(56) References Cited

U.S. PATENT DOCUMENTS

| | | | |
|---|---|---|---|
| 6,775,812 B2 * | 8/2004 | Cloudman et al. ............. | 716/112 |
| 7,383,521 B2 * | 6/2008 | Smith et al. ................... | 716/114 |
| 7,565,638 B2 * | 7/2009 | Hoerold ......................... | 716/106 |
| 7,739,632 B2 * | 6/2010 | Bergman Reuter et al. .. | 716/136 |
| 7,827,016 B1 * | 11/2010 | Ho .................................. | 703/13 |
| 7,833,817 B2 * | 11/2010 | Gao et al. ........................ | 438/57 |
| 7,849,433 B2 * | 12/2010 | Chadwick et al. ............. | 716/102 |
| 7,890,906 B2 * | 2/2011 | Chadwick et al. ............. | 716/123 |
| 8,024,673 B2 * | 9/2011 | Nitta .............................. | 716/50 |
| 8,099,685 B2 * | 1/2012 | Chew et al. .................... | 716/54 |
| 8,141,016 B2 * | 3/2012 | Correale et al. ............... | 716/111 |
| 8,232,137 B2 * | 7/2012 | Gaul et al. ..................... | 438/105 |
| 2008/0120586 A1 * | 5/2008 | Hoerold ........................... | 716/9 |
| 2009/0113359 A1 * | 4/2009 | Chew et al. ...................... | 716/4 |
| 2009/0282380 A1 * | 11/2009 | Chadwick et al. ............... | 716/9 |
| 2010/0077367 A1 * | 3/2010 | Nitta ................................. | 716/5 |
| 2011/0107291 A1 * | 5/2011 | Barwin et al. ................ | 716/134 |
| 2012/0145985 A1 * | 6/2012 | Lee ................................. | 257/4 |
| 2012/0235208 A1 * | 9/2012 | Chen et al. ................... | 257/191 |

* cited by examiner

*Primary Examiner* — Naum Levin
(74) *Attorney, Agent, or Firm* — Duane Morris LLP

(57) ABSTRACT

A method for verifying that acceptable device feature gradients and device feature disparities are present in a semiconductor device layout, is provided. The method provides for dividing a device layout into a plurality of windows and measuring or otherwise determining the device feature density within each window. The device layout includes various device regions and the method provides for comparing an average device feature density within one region to surrounding areas or other regions and also for determining gradients of device feature densities. The gradients may be monitored from within a particular device region to surrounding regions. Instructions for carrying out the method may be stored on a computer readable storage medium and executed by a processor.

10 Claims, 4 Drawing Sheets

SEMICONDUCTOR DEVICE FEATURE DENSITY GRADIENT VERIFICATION

TECHNICAL FIELD

The disclosure relates to semiconductor devices and design layouts for semiconductor devices. More particularly, the disclosure relates to verifying that the density of design features in the design layouts adheres to acceptable rules on density gradients and density disparities between device regions.

BACKGROUND

Semiconductor devices are formed of multiple layers of materials overlaid over one another. Each of the layers may be referred to as a device level. Each of the layers is formed from a corresponding photomask. The photomask is produced from an associated design layout, typically provided in software such as GDS (Graphic Database System) or GDS II which is a database file format and the de facto industry standard for design layouts in the semiconductor manufacturing industry. At each device level, the design layout is used to ultimately produce a pattern in a corresponding layer of material.

Examples of device levels, each formed from an associated design layout, are active areas formed in a substrate, polysilicon or other semiconductor interconnect layers, metal or other conductive interconnect layers, and openings such as contacts, vias and trenches formed in dielectric layers. These are representative of various other device levels. In each design layout, there are different device regions that may represent different functional portions of the device, and/or different structural features. For any particular device level such as polysilicon, the density of the device features will vary depending on the device region and device structure. When the density of the device features is different throughout a device level, it adversely affects the process capability of operations performed on that and other layers. The density of device features in a device layer also impacts topographical and other concerns for the layers formed above and below the particular device level.

For example, a device such as a bandgap reference circuit may include bipolar junction transistors, BJT's, in one or more device regions on a die and resistors in other device regions of the same die. In the resistor areas, there may be a high density of device features at the polysilicon level, for example, and a low density of device features in the active area level whereas the bipolar junction transistor device regions may include a high density of features at the active area level and a low density of features at the polysilicon level.

It would be desirable to monitor the device feature density throughout device levels.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
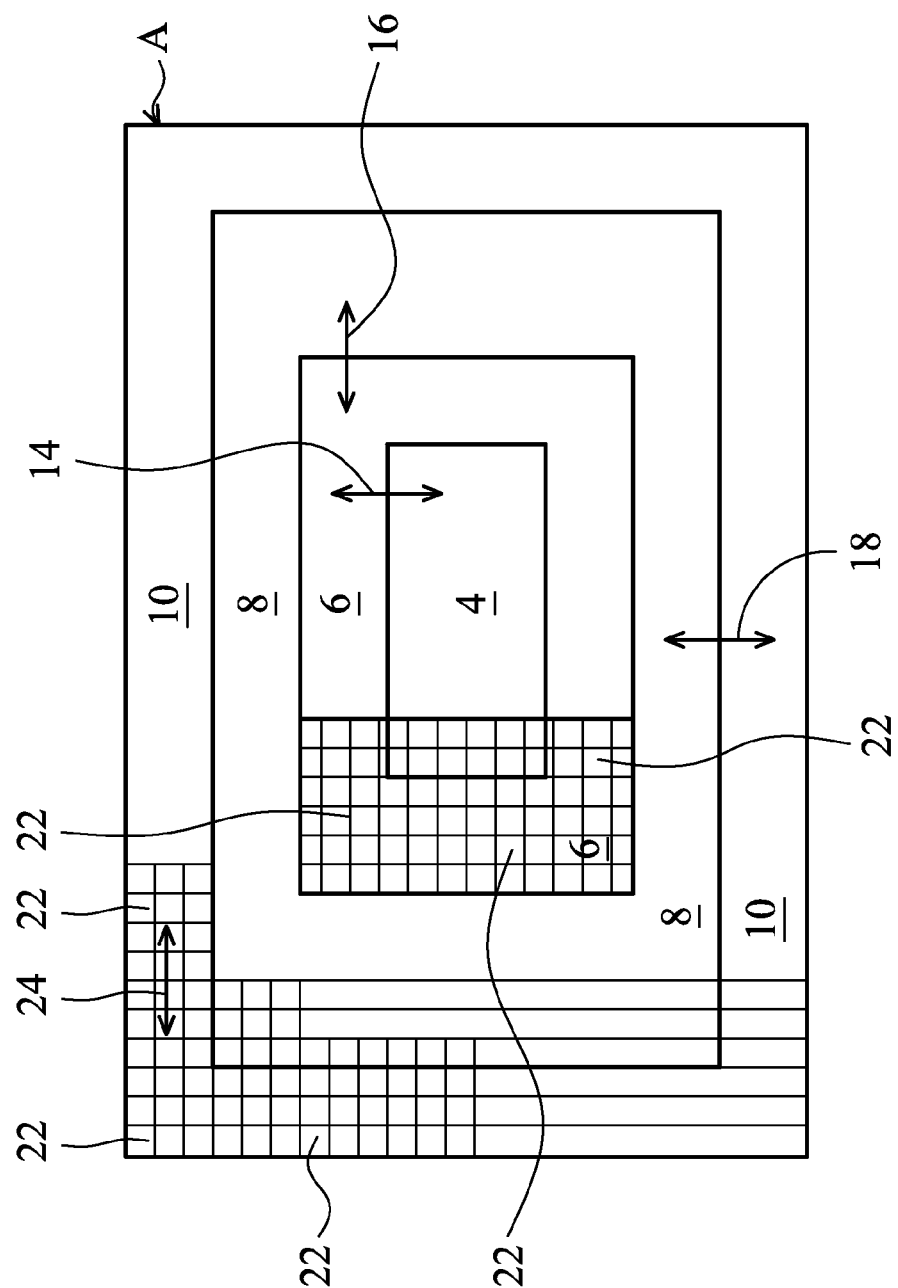
FIG. 1 is a schematic view of a design layout showing different device regions according to an embodiment of the disclosure.

Embodiments of the disclosure are applicable to all device levels of a semiconductor device. Each device level is laid out in a corresponding design layout. The disclosure provides a method and software for carrying out a design rule check (DRC). The DRC establishes rules and identifies violations of rules regarding gradients of device feature densities and disparities of device feature densities between device regions and other regions, in the design layout.

Each design layout includes a plurality of device features. In different regions of the design layout, the device features may be present in different densities. The different device regions are indicative of different functional units and/or units of different structural features according to various embodiments. Embodiments of device regions include MOS (metal oxide semiconductor) regions, bipolar junction transistor (BJT) regions, FinFET regions, resistor regions, operating amplifier regions, capacitor regions, various dummy regions, word line driver cell regions, and various other regions.

It is desirable to maintain a consistency of device feature density across the device level. Variations in device feature density across a device level can adversely impact the capabilities of processes carried out at the device level or other device levels. One such example is the density of polysilicon features at the polysilicon device level. Device regions of high density require additional processing time in etching operations, for example, to insure that the tight geometries between tightly packed polysilicon features are completely etched. The additional etching time required to clear out high density device regions may result in overetching and pattern degradation in other device regions, particularly device regions in close proximity to the high density region and/or device regions with particularly low densities. Variations in device feature densities across a device level can also result in different topographies that adversely influence overlying device levels and subsequent photolithography operations. Device performance can suffer if a consistency of device feature density is not maintained across a device level.

Embodiments of the disclosure provide for conducting a design rule check (DRC) by measuring average device feature densities throughout a device level and comparing the device feature densities to design rules. The design rule check is carried out at the GDS level, i.e., at the design layout stage prior to the manufacture of photomasks and prior to the fabrication of devices, in some embodiments. In some embodiments, the design layout is stored in a computer readable storage medium and is provided to a computer aided design tool or other processor, in GDS II or other suitable formats. GDS II (Graphic Database System II) is a database file format and the de facto industry standard for design layouts in the semiconductor manufacturing industry and is a binary file format representing planar geometric shapes, text labels, and other information about the layout in hierarchical form. The design rules are stored in a computer readable storage medium in various embodiments and the determination of device feature densities and the design rule checks, may be carried out by a processor executing a computer readable storage medium, or using various other methods.

The device feature densities are obtained by measuring or otherwise determining device feature density within a predetermined window in some embodiments. The window may be of various dimensions. In some embodiments, the design layout is divided into small windows of a fixed, predetermined size and device feature density obtained for each window. The device feature density of each window is averaged and presented as an average device feature density in many embodiments. The predetermined window within which device feature density is measured and averaged, is square or rectangular in shape and of various sizes, in various embodiments. In still other embodiments, the windows have various other, different geometric shapes.

The disclosure also provides for establishing design rules related to device feature densities and device feature density gradients in a design layout. The design rules include rules regarding acceptable density gradients within sensitive regions or within other regions, acceptable density gradients between sensitive regions and surrounding regions or other adjacent regions or between other regions in the design layout. In some embodiments, the design rules also include acceptable ranges for device feature densities in adjacent windows or for acceptable ranges for average densities in adjacent device regions. Design rules regarding acceptable disparities between device feature densities of adjacent or other device regions or between a device region and a surrounding region are also used in some exemplary embodiments. The design rules are stored in a computer readable storage medium, in one embodiment.

The disclosure applies to any and all integrated circuit and other semiconductor device designs and to various technologies and applications.

With design rules established, the various device regions described above, may include one or a multitude of individual windows. In some embodiments, the entire device level including multiple device regions, is divided into windows of a predetermined size and the device feature density measured in each window. The device feature density is determined and may be averaged for each window by known measurement and mathematical techniques that determine which portion of a window is occupied by the device features. The device feature density in each window is determined and used. Densities in adjacent windows or adjacent regions may be determined. Average device feature densities of the individual windows are used to determine density gradients across the device level in various directions and within and between various device regions in various embodiments. In some embodiments, density disparities between device regions or between a device region and a surrounding region, are determined. The disclosure also provides for identifying sensitive regions that are most sensitive to variations in device feature density. The sensitive regions are designated by designers or process engineers for various reasons. Once the density gradients and density disparities are determined, they are then compared to the associated design rule and violations of the design rules are identified. According to various embodiments, corrective action is then taken to correct the device feature density disparity or device feature density gradient that violates the design rules.

Having described concepts of the disclosure in general terms, reference is now made to the figures which provide illustrative embodiments. The following description will be provided using polysilicon as the device feature and device level but such is intended to be exemplary only and the teachings of the disclosure may be applied to any and all of the design layouts used to form a respective device level of an integrated circuit or other semiconductor device. The device levels include but are not limited to active areas formed in a substrate, other semiconductor, metal or other conductive layers, openings such as contacts, vias and trenches formed in dielectric layers, FinFET's made of various combinations of materials, and capacitor plates formed of various combinations of materials.

Now turning to the figures, FIG. 1 is a plan view of a portion of a design layout used to form a corresponding device level in an integrated circuit or other semiconductor device. FIG. 1 represents only a small portion of such a design layout and is presented in schematic form. Design layout portion 2 includes four illustrated device regions: central device region 4 and surrounding device regions 6, 8 and 10. The device regions 4, 6, 8 and 10 are indicative of different functional units in the semiconductor device in some embodiments and/or device regions 4, 6, 8 and 10 contain different structural features in some embodiments. Device regions 4, 6, 8 and 10 may each be any of the aforementioned exemplary device regions. Device region 10 surrounds device region 8, which surrounds device region 6 which, in turn, surrounds central device region 4. This is exemplary only and the various device regions may be adjacent one another or spaced from one another and may have any of various other spatial relationships, in various embodiments.

According to an embodiment in which design layout portion 2 is for a polysilicon device level, the density of polysilicon features in each device region 4, 6, 8 and 10 is determined. In various embodiments, the density of polysilicon features in each device region 4, 6, 8, 10 is determined and averaged and used in further calculations as an average device feature density. According to one embodiment, the device feature densities are determined by dividing the device regions into a plurality of windows of predetermined size and measuring the portion of the window occupied by a polysilicon structure, e.g. the portion of the photomask that is opaque in a positive photoresist system. In the illustrated embodiment, the design layout portion 2 is divided into a plurality of predetermined windows 22. The device feature density is determined within each window 22 in some embodiments. Various measurement or other methods for determining device feature density in an area, may be used. Each device region 4, 6, 8 and 10 is divided into a multitude of windows 22. It should be understood that, according to various embodiments, windows 22 will be present across the entirety of design layout portion 2, although windows 22 only appear in representative portions of FIG. 1 for illustrative simplicity and clarity.

Windows 22 may be of various dimensions and may take on various shapes. According to one exemplary embodiment, windows 22 are 10×10 micron windows. According to another embodiment, windows 22 are 100×100 micron windows. According to yet another embodiment, windows 22 are 1000×1000 micron windows, although other sizes and shapes may be used in other embodiments. In other embodiments, windows 22 are rectangular or triangular in shape. Various criteria may be used to establish the size of window 22. According to some exemplary embodiments, windows 22 within which device feature density is measured and averaged, are rectangular in shape such as a 50×100 micron window or a 10×20 micron window.

In some embodiments, average device feature density is determined for each window 22. The overall average device densities within each of the respective device regions 4, 6, 8, 10 is obtained by averaging the average device densities within each of windows 22 contained within the respective device region 4, 6, 8, 10 or by using various other mathematical techniques.

Once device feature densities within each of windows 22, and within device region 4 and surrounding device regions 6, 8 and 10 are determined, the disclosure provides for determining device feature density gradients and device feature density disparities. In one embodiment, the gradient of device feature densities along line 14 between adjacent device regions 4 and 6 is determined. In another embodiment, the overall average device feature density within device region 4 is obtained and compared to the overall average device feature density within device region 6 and the disparity between the two overall averages is determined. In various embodiments, the gradient of device feature densities along line 16 between adjacent device regions 6 and 8 is also determined. In another embodiment, the overall average device feature density within device region 6 is obtained and compared to the overall average device feature density within device region 8 and the disparity between the two overall averages is determined. According to another embodiment, the gradient of device feature densities along line 18 between adjacent device regions 8 and 10 is also determined. In some embodiments, the overall average device feature density within device region 8 is obtained and compared to the overall average device feature density within device region 10 and the disparity between the two overall averages is determined. Device feature density gradients may also be determined in various other locations within design layout portion 2. In one embodiment, the device feature density gradient along line 24 which is completely within device region 10, is determined. Line 24 is illustrated to extend along a single row of windows 22. In other embodiments, the device feature density gradient may be determined along various directions in design layout portion 2 and including any number of windows 22. Device feature density gradients may be expressed in density per unit length or using other suitable conventions.

Once the device feature density gradients and disparities are determined, they are compared to design rules regarding the same in various embodiments. The design rules are determined and generated by various criteria including processing and design considerations. The numerical values for acceptable gradients and disparities may vary and depend on device technology and other considerations.

Although design layout portion 2 is shown in graphical form in FIG. 1 representing the physical device layout for illustrative purposes, the average device feature densities may be determined and the gradients and disparities also determined during a design rule check carried out at the GDS level, i.e., using a processor at the design layout stage prior to the manufacture of the physical semiconductor device level.

Figure 2:
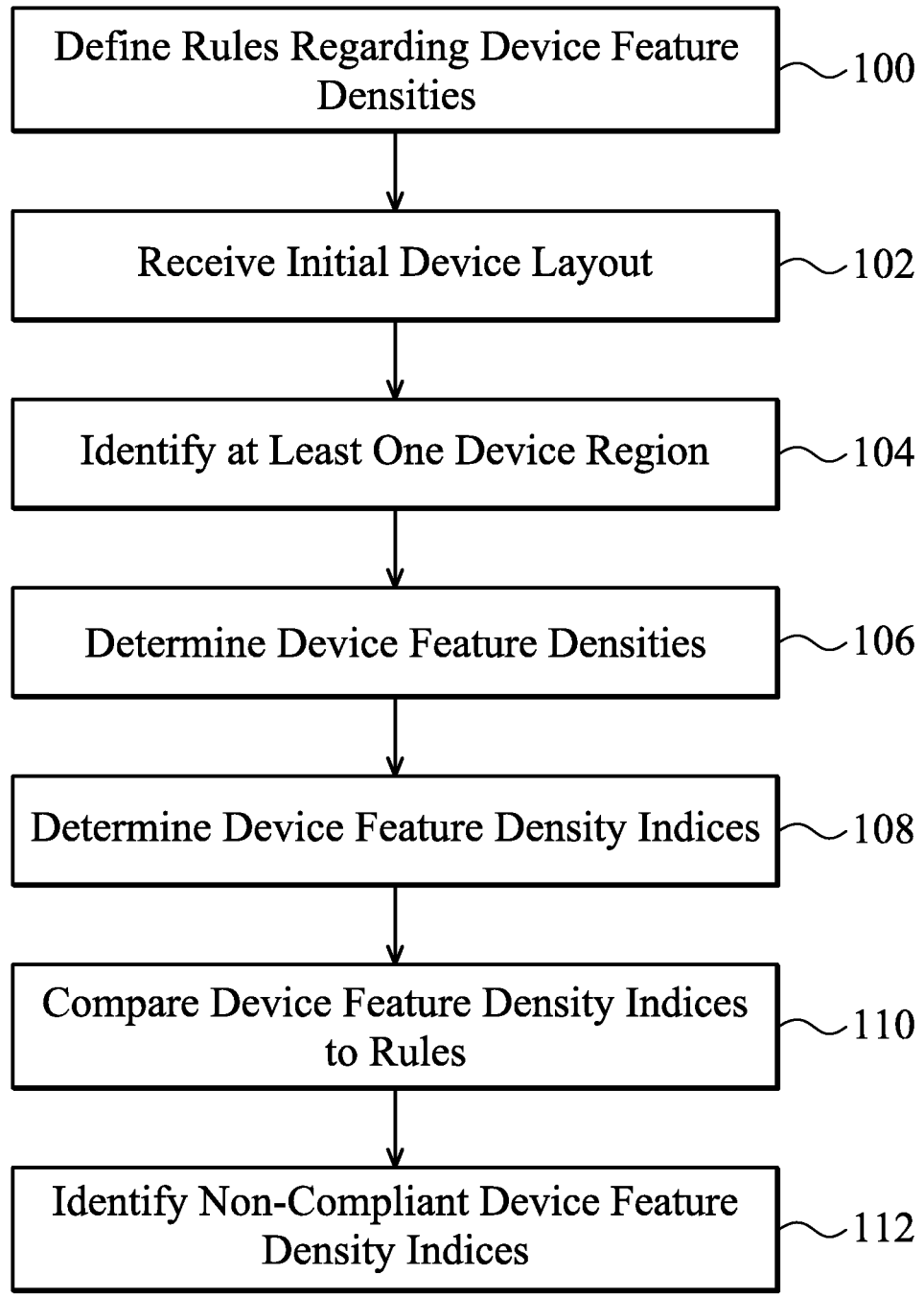
FIG. 2 is a flow chart of an embodiment of a method according to the disclosure.

FIG. 2 is a flow chart showing an exemplary method for the verification of device feature density gradients, ranges and disparities according to the disclosure. Step 100 provides for defining rules regarding device feature density gradients, ranges and disparities. The design rules are design rules related to device feature densities and device feature density gradients and disparities in a design layout, according to various embodiments. The design rules are described in further detail above. Step 102 provides for receiving an initial device layout. The initial device layout may be contained in software that may be in GDS format, GDS II format or other suitable database file formats used for design layouts in the semiconductor manufacturing industry. Optional step 104 provides for identifying at least one device region. The device region may be identified as a sensitive region for any of various processing or design rule reasons. The device regions include the previously discussed device regions identified as a particular functional region in a device or a region characterized by having particular structures. In some embodiments, an arbitrarily designated spatial portion of a design layout is identified as a device region. Alternatively, device regions are identified as such based upon various processing or design rule considerations.

Step 106 provides for determining device feature densities. This may be carried out by measuring average device feature densities in a multitude of windows of predetermined size. Step 106 also provides for determining an overall average of the window averages in a grouping of windows such as within one of the identified device regions. Step 106 also provides for determining the overall average device feature density in a design layout, in some embodiments. Step 108 provides for determining device feature density indices based on the device feature densities determined at step 106. At step 108, indices such as device feature density gradients within and between device regions are determined in various embodiments. Device gradients are determined in a region including a device region and surrounding regions, in some embodiments. Step 108 also provides for determining disparities between average device feature densities within a device region and surrounding areas or between device regions. At step 110, the determined device feature density indices from step 108 are compared to the rules regarding device such feature densities. Step 112 provides for identifying noncompliant device feature density indices or verifying that the device feature density indices comply with the design rules.

Figure 3:
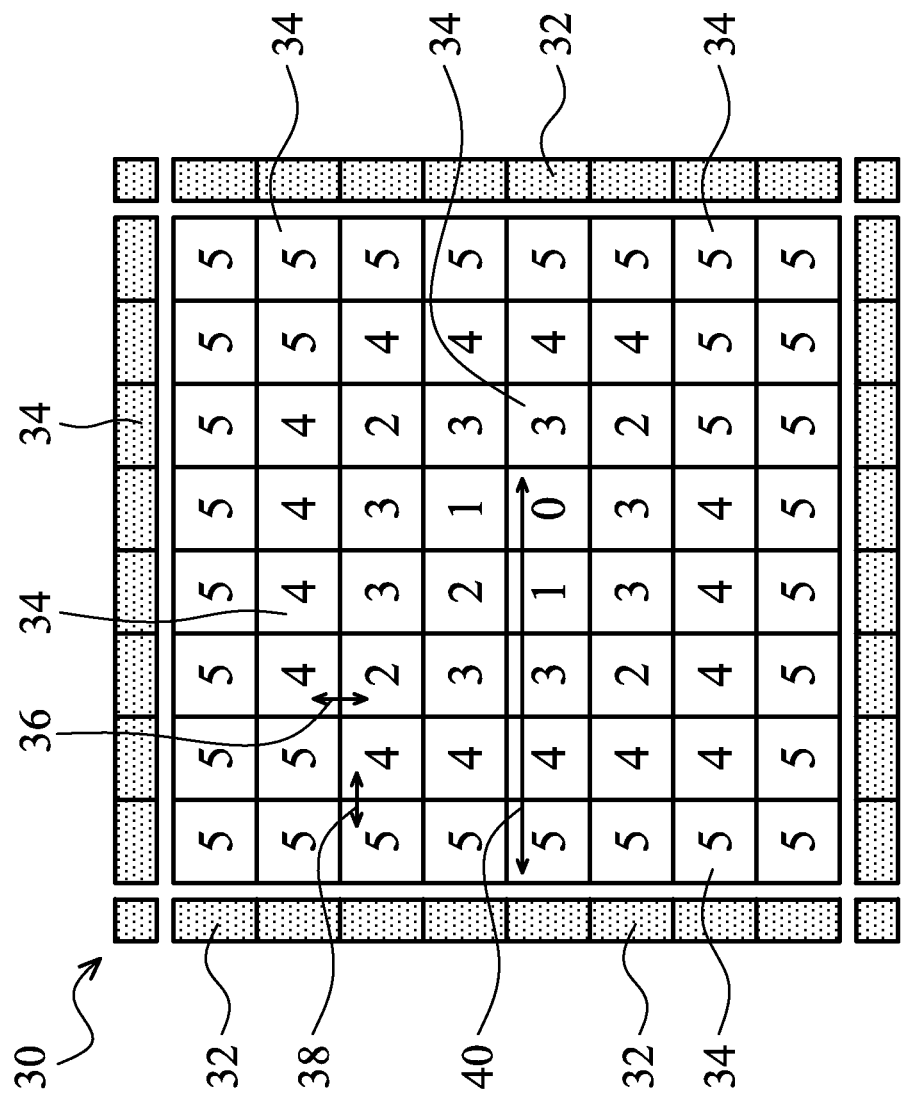
FIG. 3 is a schematic of a design layout with different device regions according to an embodiment of the disclosure.

FIG. 3 is an exemplary design layout for a corresponding device level of a semiconductor device. Design layout 30 is shown in schematic form and is divided into outer cells 32 and inner cells 34. Each inner cell 34 is identified by a numeral and the numerals may refer to different functional portions of the design layout, i.e., different device regions, in some embodiments. Outer cells 32 are dummy cells in one embodiment. In other embodiments, outer cells 32 are active cells. Each of the inner and outer cells may be divided into a number of device windows such as discussed above. Each of the associated numerals 0-5 may be indicative of a particular device region and many embodiments provide for determining device feature density disparities between adjacent device regions designated by different numerals, i.e. between different device regions. In one embodiment, the difference between the overall average device feature densities of adjacent device regions is determined such as indicated by arrows 36 and 38. The disclosure also provides for determining the device feature density gradient along line 40 that extends among five different device regions 34, but this is intended to be exemplary and the disclosure provides for determining device feature density gradients along various directions and along and including various number of cells.

Figure 4:
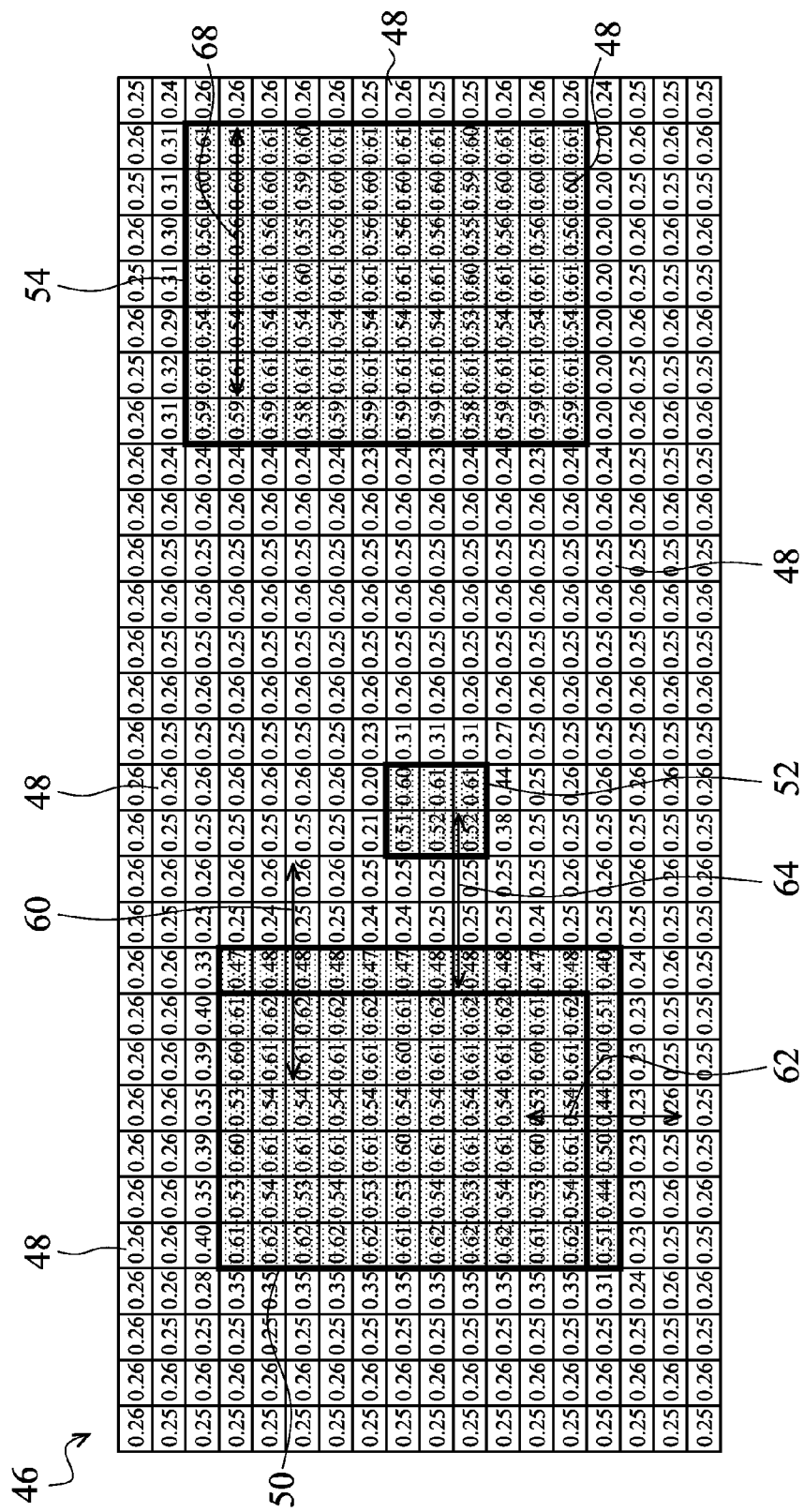
FIG. 4 is a schematic of a design layout showing density values in predetermined windows of the design layout.

FIG. 4 is a diagram representing device feature densities in an exemplary design layout and includes numerical density values. Design layout 46 represents a portion of a device level and is divided into windows 48. Windows 48 are regularly arranged and regularly repeating. In one embodiment, windows 48 are each 10×10 μm windows, but other dimensions are used in other exemplary embodiments. An exemplary device feature density value appears within each individual window 48. In one embodiment, the units such as 0.26 represent the portion of the associated window 48 that is occupied by a polysilicon feature but the units may have other meanings in other exemplary embodiments. The numerical values represent an average device feature density in various exemplary embodiments.

According to some embodiments, the device feature density gradients are taken along any of various rows of windows, along any of various columns of windows, along a row of two or more windows, along a column of two or more windows, and so on. Device layout 46 also includes three device regions that are shaded in the illustrated embodiment and also bounded by double lines for illustrative purposes only.

Device regions 50, 52 and 54 each include a multitude of individual windows 48. Device regions 50, 52 and 54 are as previously described and either or all of device regions 50, 52 and 54 may be identified as a sensitive device region, most sensitive to device feature density disparities and gradients between the sensitive device region and other areas. In one embodiment, the overall average device feature density of the device region of interest, e.g. device region 50, is obtained by averaging the individual average device feature densities of the windows 48 in the device region of interest. This overall average is compared to the overall device feature density average throughout design layout 46 in one embodiment. Various numerical values for acceptable device feature density disparities are used. The overall average is compared to device feature densities in areas that surround the device region of interest in other embodiments. In one embodiment, a device feature density gradient along line 60 is determined and in another embodiment, the device feature density gradients along lines 62 and 64 are determined. The device feature density gradients are expressed in density per length or using other suitable units or conventions and represents the change in device feature density per length, according to various embodiments. In one embodiment, windows 48 may be defined such that a +/−10% change in device feature density from window to window is acceptable. In other embodiments, other values are used. According to still another embodiment, a device density gradient may be taken within a device region such as device region 54, such as along line 68. The change in device feature density per distance is monitored along a direction one of the device regions 50, 52 or 54 in various embodiments.

The previously discussed device feature density gradients and device feature density disparities are intended to be exemplary only and in various other embodiments, various other device density feature indices are determined. The indices may relate to device feature density gradients along a direction, device feature density disparities between regions, and ranges of device featured densities within a region. Various other indices may be calculated using the average device feature densities determined for the respective windows.

After the various indices are calculated or otherwise determined, the disclosure provides for comparing the indices to the associated design rules regarding the same to verify that the measured or otherwise determined device feature density indices comply with the associated design rules. Device feature indices that do not comply with the design rules are identified and corrective action is taken in some embodiments. The corrective action may include but is not limited to re-design of the design layout of interest or of another design layout responsive to the violation in the device layout of interest. In other embodiments, the corrective action includes process adjustment or optimization for processing operations that are sensitive to device feature density indices that violate design rules.

According to one embodiment, a method for verifying densities in a semiconductor device layout is provided. The method includes receiving a first design layout of a device level of a semiconductor device including device features; dividing at least a portion of the first design layout into a plurality of windows; determining densities of the device features in each of the plurality of windows; and determining density indices that characterize the first design layout, the density indices including at least one of a first device feature density gradient and first device feature density disparities between portions of the semiconductor device in the first design layout.

According to another embodiment, a method for verifying densities in a semiconductor device layout is provided. The method includes: defining rules regarding device feature density disparities in a design layout of a device level; receiving a first design layout of a device level including the device features; dividing at least a portion of the first design layout into a plurality of windows; determining densities of the device features in each of the plurality of windows; and defining device regions in the first design layout, each device region including an associated plurality of the windows. The method also includes determining a disparity between an average device feature density of a first device region of the device regions and an average device feature density of a second device region of the device regions; comparing the device feature disparity to the rules regarding device feature density disparities; and identifying if the disparity violates the rules regarding device feature density disparities.

According to another embodiment, a method for verifying densities in a semiconductor device layout is provided. The method provides for: defining rules regarding device feature density gradients; receiving a layout of a device level including the device features; dividing at least a portion of the layout into a plurality of windows; determining average densities of the device features in each of the plurality of windows; determining device density gradients in the layout based on the average densities; comparing the device density gradients to the device feature density gradient rules; and identifying any areas in which one of the device density gradients violates the rules regarding device feature density gradients.

According to another aspect, a tangible computer readable storage medium is provided. The tangible computer readable storage medium is encoded with computer program code such that, when the computer program code is executed by a processor, the processor performs a method comprising: receiving a layout of a device level including device features; dividing at least a portion of the layout into a plurality of windows; determining densities of the device features in each of the plurality of windows; determining an overall average device feature density in the layout; defining device regions in the layout, each device region including an associated plurality of the windows; determining an average device feature density of at least first device region and an adjacent device region of the device regions; and determining a disparity between the average device feature densities of the first device region and the adjacent device region. The disparity is compared to device feature density disparity rules in some embodiments.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for verifying densities in a semiconductor device layout, said method comprising:
   receiving, using a computer, a design layout of a device level of a semiconductor device including device features;
   dividing at least a portion of said design layout into a plurality of windows;
   determining densities of said device features in each of said plurality of windows;
   determining density indices that characterize said first design layout based on said determined densities, said density indices including at least one of a first device feature density gradient and first device feature density disparities between portions of said semiconductor device in said design layout,
   establishing design rules including device feature density disparity rules for said design layout and storing said design rules in a tangible computer readable storage medium;
   comparing said first device feature density disparities to said stored design rules; and
   identifying if any of said first device feature density disparities violate said device feature density disparity rules.

2. The method as in claim 1, further comprising:
   defining device regions in said design layout, each said device region including an associated plurality of said windows; and
   wherein said determining density indices includes determining said first device feature density disparity between an average device feature density of a first device region of said device regions and an average device feature density of a second device region of said device regions.

3. The method as in claim 2, wherein said first and second device regions are adjacent one another.

4. The method as in claim 2, wherein said second device region surrounds said first device region and each of said windows includes a dimension of about 10 microns×10 microns.

5. The method as in claim 2, wherein said device features comprise polysilicon features, said first device region comprises a resistor area and said second device region comprises a bipolar junction transistor area.

6. The method as in claim 2, wherein said determining said first device feature density disparity comprises determining said average device feature density of said first device region and said average device feature density of said second device region using said densities of said device features in each of said plurality of windows.

7. The method as in claim 2, further comprising determining an overall average density of said device features in said design layout and determining a further disparity between said average device feature density of said first device region and said overall average device feature density.

8. The method as in claim 1, wherein said design layout is stored in a tangible computer readable storage medium and said receiving a first design layout comprises a processor receiving said first design layout in GDS II database file format.

9. The method as in claim 1, wherein said device features comprise polysilicon features.

10. The method as in claim 1, wherein said device features comprise one of contacts, vias and trenches formed in dielectric layers, and FinFET's.

* * * * *

UNITED STATES PATENT AND TRADEMARK OFFICE
CERTIFICATE OF CORRECTION

| | | |
|---|---|---|
| PATENT NO. | : 8,549,453 B2 | Page 1 of 1 |
| APPLICATION NO. | : 13/362914 | |
| DATED | : October 1, 2013 | |
| INVENTOR(S) | : Young-Chow Peng et al. | |

It is certified that error appears in the above-identified patent and that said Letters Patent is hereby corrected as shown below:

In the Claims

Column 9, Claim 1, line 40, replace "said first" with --said--

Signed and Sealed this
Ninth Day of September, 2014

Michelle K. Lee
*Deputy Director of the United States Patent and Trademark Office*